United States Patent [19]
Seong

[11] Patent Number: 5,606,296
[45] Date of Patent: Feb. 25, 1997

[54] PULSE WIDTH MODULATION CONTROL CIRCUIT

[75] Inventor: Hwan-Ho Seong, Seoul, Rep. of Korea

[73] Assignee: Samsung Electronics Co., Ltd., Suwon, Rep. of Korea

[21] Appl. No.: 600,867

[22] Filed: Feb. 13, 1996

[30] Foreign Application Priority Data

Jul. 27, 1995 [KR] Rep. of Korea .................. 95-22530

[51] Int. Cl.$^6$ .................. H03B 5/24; H03K 7/08; H03K 3/013
[52] U.S. Cl. .................. 332/109; 327/172; 331/143; 348/730
[58] Field of Search .................. 332/107, 109, 332/110, 111; 331/111, 143; 327/172, 176; 348/500, 510, 730

[56] References Cited

U.S. PATENT DOCUMENTS

| | | | |
|---|---|---|---|
| 4,742,316 | 5/1988 | Riedger | 332/110 |
| 4,941,078 | 7/1990 | Leonardi | 363/97 |
| 5,418,501 | 5/1995 | Schoofs et al. | 331/143 X |
| 5,457,435 | 10/1995 | Hoffman | 332/110 |
| 5,546,054 | 8/1996 | Maccarrone et al. | 331/143 X |

*Primary Examiner*—David Mis
*Attorney, Agent, or Firm*—Cushman Darby & Cushman IP Group of Pillsbury Madison & Sutro LLP

[57] ABSTRACT

A pulse width modulation control circuit of the present invention causes variation amplitudes of a sawtooth voltage in a sawtooth oscillator being synchronized by an external signal to be lowered thereby improving characteristics with respect to both a noise and a system control. The pulse width modulation control circuit includes a sawtooth oscillating means for generating a sawtooth voltage after receiving the synchronizing signal, that is, a synchronizing frequency; a sawtooth controller for receiving the sawtooth voltage generated from the sawtooth oscillating means, also receiving a reference voltage with respect to the sawtooth voltage, and outputting a current controlling constantly an amplitude of the sawtooth voltage to the sawtooth oscillating means; and a pulse width modulating means for receiving an output voltage, also receiving a reference voltage with respect to the output voltage, then receiving the sawtooth voltage generated from the sawtooth oscillating means 100, modulating a pulse width.

4 Claims, 3 Drawing Sheets no synchronizing signal low-frequency synchronizing signal high-frequency synchronizing signal

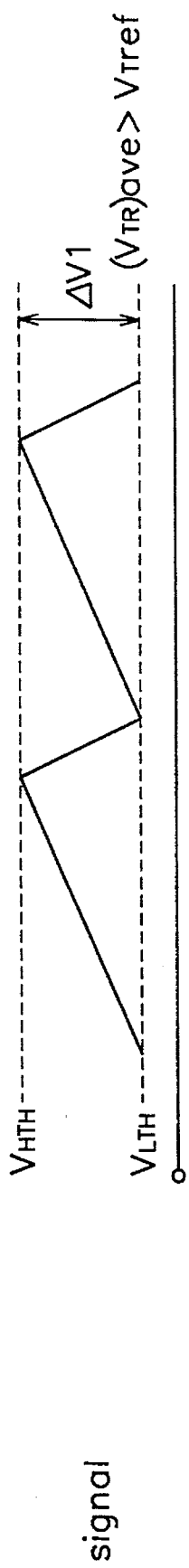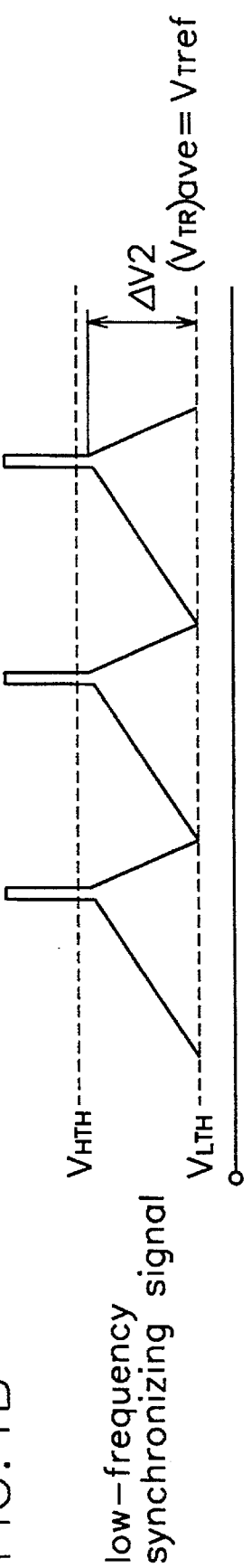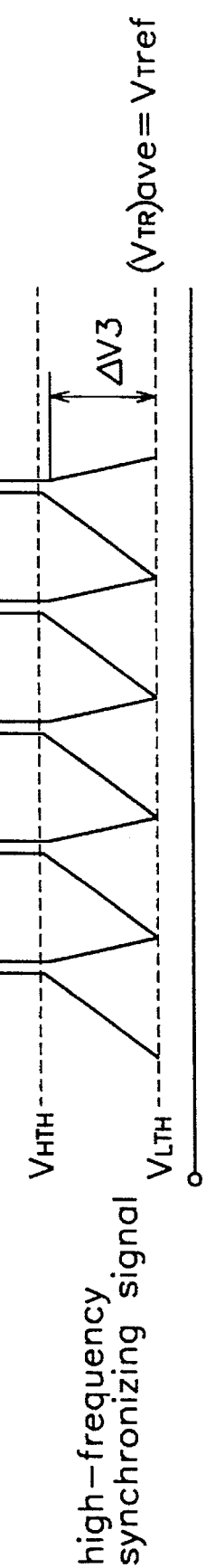

PULSE WIDTH MODULATION CONTROL CIRCUIT

BACKGROUND OF THE INVENTION

(1) Field of Invention

The present invention relates to a pulse width modulation control circuit, and more particularly, to a pulse width modulation control circuit for stable synchronization throughout a wide range of frequencies.

(2) Description of the Prior Art

A display device using a cathode-ray tube, such as a television, or a monitor, has two synchronizing circuits, typically a vertical deflection circuit and horizontal deflection circuit. Since a horizontal deflection circuit is a high-frequency circuit, operating at a frequency typically beyond tens of kilohertzes, if the circuit causes interference related to a switching frequency of a switching mode power supply (SMPS), there is noise on the screen.

However, such interference can be minimized by synchronization. That is, a synchronization means operates the switching mode power supply according to the frequency of the horizontal deflection circuit.

The horizontal deflection frequency is fixed in the display device of a television set, whereas, in a monitor, the horizontal deflection frequency varies by a factor of two or three times, according to which one of various display methods is used.

As related technologies, "Regulating pulse width modulation" is described in 'Data book' manufactured by Unitrode corporation, pp. 54–59, 1993–1994; and, "Practical considerations in current mode power supplies—III synchronization" is described in 'Application note' manufactured by Unitrode Corporation, pp. 139–144, 1993–1994.

In the drawings hereof:

FIG. 1 shows a conventional pulse width modulation control circuit; and

FIGS. 2A, 2B, and 2C show voltage variation according to a synchronizing signal in the conventional pulse width modulation control circuit using a sawtooth wave.

As shown in FIG. 1, the conventional pulse width modulation control circuit includes a sawtooth oscillator for generating a sawtooth voltage after receiving the synchronizing signal, that is, a synchronizing frequency; a sawtooth generating means 11 including a capacitor; an error amplifier 12; and a comparator 13 for outputting a pulse width modulating signal after receiving the output signals of both the sawtooth oscillator 11 and the error amplifier 12.

As the frequency applied to the conventional pulse width modulation control circuit increases, voltage amplitudes $\Delta V2$ and $\Delta V3$ determining a pulse width decrease inversely proportionals to the frequency value, as shown in FIGS. 2B and 2C. Accordingly, when the voltage amplitudes $\Delta V2$ and $\Delta V3$ vary, the conventional pulse width modulation circuit varies the gain of system transfer function in proportion to the $\Delta V2$ and the $\Delta V3$. Therefore, it is difficult to achieve system optimization, and the pulse width is sensitive to noise as much as a lowered voltage amplitude.

SUMMARY OF THE INVENTION

An object of the present invention is to provide a pulse width modulation control circuit which maintains constant the voltage amplitude $\Delta V$ of a sawtooth wave, irrespective of variation of a synchronizing signal (that is, a synchronizing frequency), improves control characteristics of the system, and is relatively insensitive with respect to noise.

In order to achieve this object, the present invention includes a sawtooth oscillating means for generating a sawtooth voltage after receiving a synchronizing signal as an input; a sawtooth controlling means for receiving the sawtooth voltage generated from the sawtooth oscillating means, receiving a reference voltage with respect to the sawtooth voltage, and outputting a current controlling constantly the amplitude of the sawtooth voltage to the sawtooth oscillating means; and a pulse width modulating means for receiving the output voltage, also receiving a reference voltage with respect to the output voltage, receiving the sawtooth voltage generated from the sawtooth oscillating means, and modulating pulse width, e.g. a pulse width modulation control circuit for synchronizing a switching mode power supply according to the frequency of a horizontal deflection circuit of a cathode-ray tube-type display having a variable horizontal deflection frequency.

DETAILED DESCRIPTION OF THE PREFERRED EMBODIMENT

A preferred embodiment of the present invention will become apparent from a study of the following detailed description, when viewed in light of the accompanying drawings.

Figure 1:
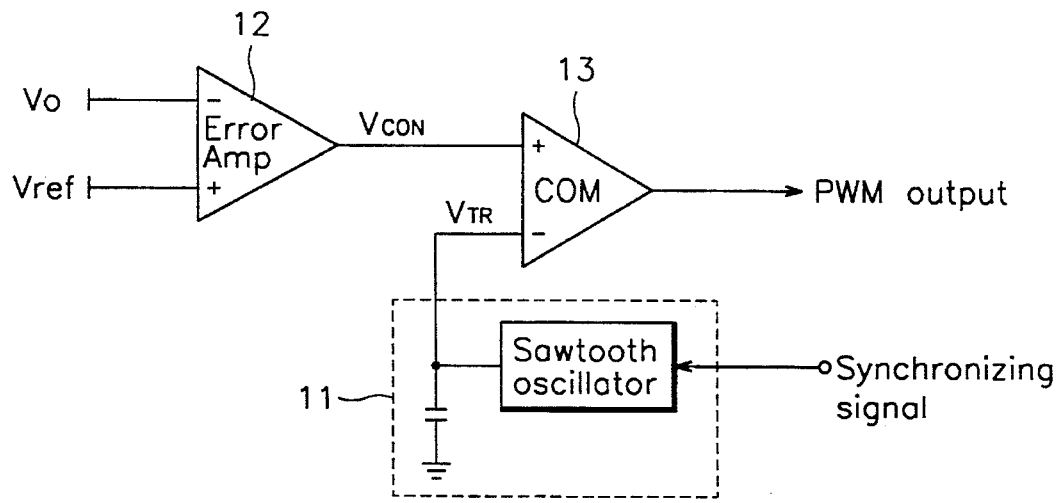
FIG. 1 shows a conventional pulse width modulation control circuit.
Figure 2A:
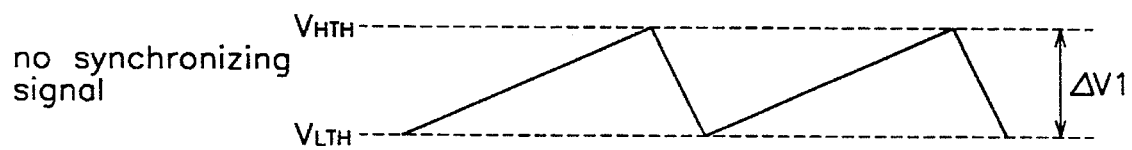
FIG. 2A shows voltage variation according to no synchronizing signal in the conventional pulse width modulation control circuit using a sawtooth wave.
Figure 2B:
FIGS. 2B and 2C show voltage variation according to a synchronizing sign in the conventional pulse width modulation control circuit using a sawtooth wave.
Figure 2C:
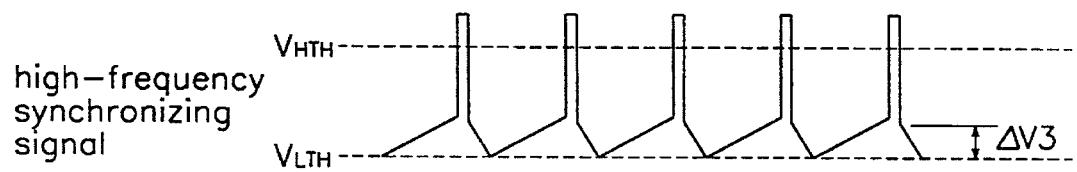
Figure 3:
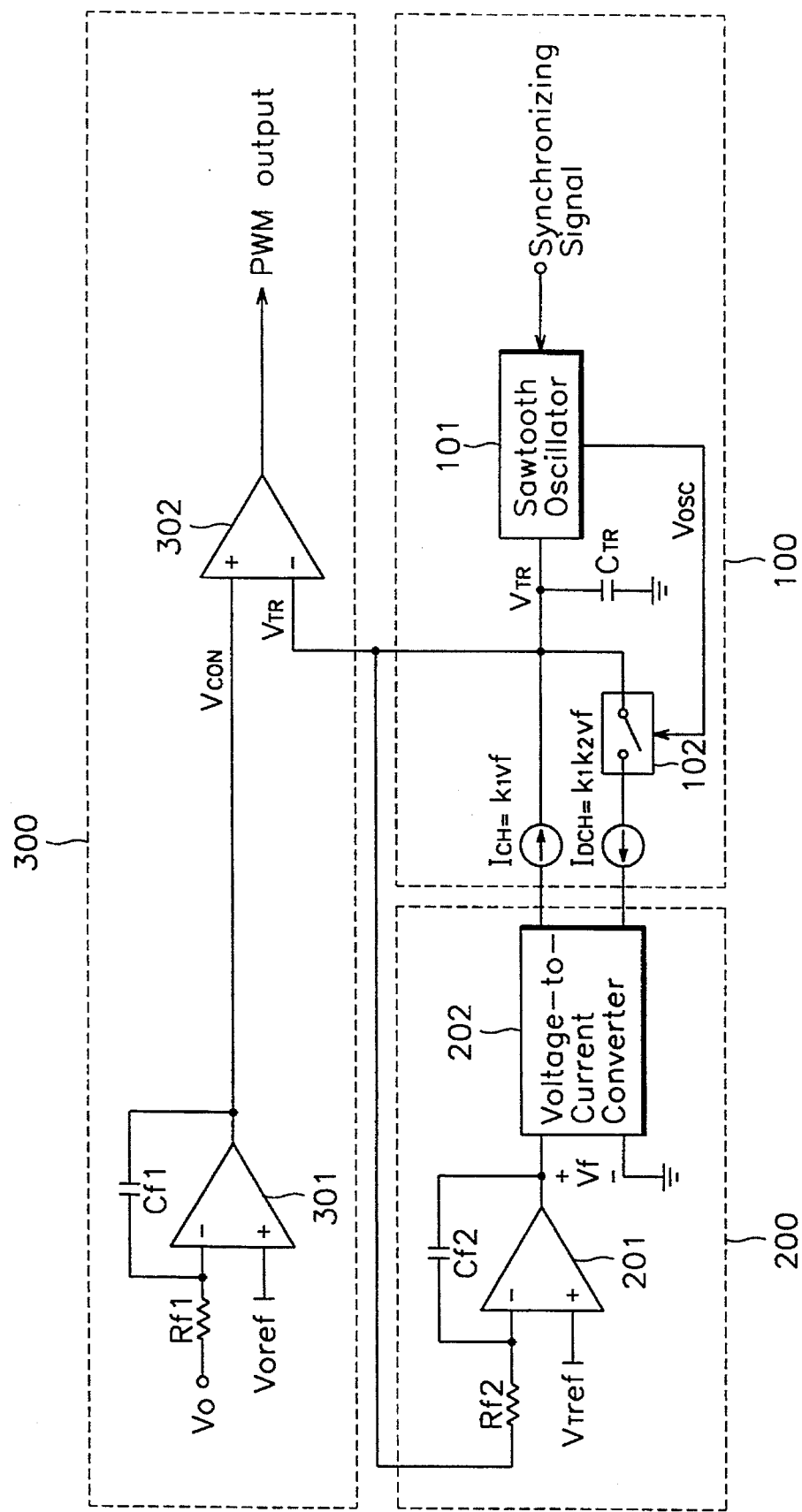
FIG. 3 shows a pulse width modulation control circuit in accordance with a preferred embodiment of the present invention; and FIGS., 4A, 4B, and 4C show voltage variation according to a synchronizing signal in a pulse width modulation control circuit in accordance with the preferred embodiment of the present invention.

As shown in FIG. 3, a pulse width modulation control circuit in accordance with a preferred embodiment of the present invention includes a sawtooth oscillating means 100 for generating a sawtooth voltage $V_{TR}$ after receiving a synchronizing signal (that is, a synchronizing frequency); a sawtooth controlling means 200 for receiving the sawtooth voltage $V_{TR}$ generated from the sawtooth oscillating means 100, receiving a reference voltage $V_{Tref}$ with respect to the sawtooth voltage $V_{TR}$, and outputting a current controlling constantly the amplitude $\Delta V$ of the sawtooth voltage $V_{TR}$ to the sawtooth oscillating means 100; and a pulse width modulating means 300 for receiving an output voltage $V_O$, receiving a reference voltage $V_{Oref}$ with respect to the output voltage $V_O$, receiving the sawtooth voltage $V_{TR}$ generated from the sawtooth oscillating means 100, and modulating a pulse width of the sawtooth voltage $V_{TR}$.

The sawtooth oscillating means 100 includes a sawtooth oscillator 101 for receiving the synchronizing signal, and outputting both the sawtooth voltage $V_{TR}$ and the switching controlling voltage $V_{OSC}$; a capacitor $C_{TR}$ for charging or discharging the sawtooth voltage $V_{TR}$ outputted from the sawtooth oscillator 101, wherein one terminal is connected to three elements (namely, the sawtooth oscillator 101, the sawtooth controlling means 200, and the pulse width modulating means 300) and the other terminal is grounded; and a voltage controlled switch 102 for controlling a charge/discharge current flowing in the capacitor $C_{TR}$ according to the switching controlling voltage $V_{OSC}$ of the sawtooth oscillator 101, wherein one side terminal is connected to the pulse width modulating means 300 and the other terminal is connected to the sawtooth controlling means 200.

The sawtooth controlling means 200 includes a second error amplifier 201 for receiving the sawtooth voltage $V_{TR}$ flowing in a second resistor Rf2 through a negative terminal of the amplifier 201, also receiving the reference voltage $V_{Tref}$ to the sawtooth voltage $V_{TR}$ through a positive terminal of the amplifier 201, and including a second capacitor Cf2 between an output terminal and the negative terminal; and a voltage-to-current converter 202 for receiving the output voltage $V_f$ of the second error amplifier 201, converting the voltage $V_f$ to a current, and outputting the current to the sawtooth oscillating means 100.

The pulse width modulating means 300 includes a first error amplifier 301 for receiving the output voltage $V_O$ flowing in the first resistor $R_{f1}$ through a negative terminal of the amplifier 301, receiving the reference voltage $V_{Oref}$ to the output voltage $V_O$ through a positive terminal of the amplifier 301, and including a first capacitor $C_{f1}$ between an output terminal and the negative terminal; and a comparator 302 for receiving the output of the first error amplifier 301 through a positive terminal of the comparator 302, receiving the sawtooth voltage $V_{TR}$ Of the sawtooth oscillating means 100 through a negative terminal of the comparator 302, and modulating the pulse width of the sawtooth voltage $V_{TR}$.

The sawtooth oscillator 101 generates the sawtooth voltage $V_{TR}$ as follows.

Since the switch controlling voltage 102 is open in case that the switch controlling voltage $V_{OSC}$ is zero, the capacitor $C_{TR}$ charges a current $I_{CH}$ equal to $K_1 V_f$. At this time, the sawtooth oscillator 101 has a threshold voltage of $V_{HTH}$ so that the capacitor $C_{TR}$ continues to charge until $V_{TR} \geq V_{HTH}$. At $V_{TR} \geq V_{HTH}$, the switch controlling voltage $V_{OSC}$ becomes '1' and the threshold voltage becomes $V_{LTH}$ so that the voltage controlled switch 102 can be closed. At this time, if the voltage-to-current converter 202 is designed to be $I_{CH} < I_{DCH}$ (equal to $K_1 K_2 V_f$, where $K_2 > 1$), the capacitor $C_{TR}$ discharges a current value of $I_{DCH} - I_{CH}$. Then, by continuous discharge, the value of a voltage controlled switch $V_{OSC}$ becomes zero at $V_{TR} \leq V_{LTH}$. The charging operation of the sawtooth oscillator 101 is restored and one cycle is completed.

Meanwhile, a minimum frequency in case of no synchronizing signal is achieved as explained in the following description.

If the reference voltage $V_{Tref}$ concerning the sawtooth voltage $V_{TR}$ is sufficiently lower than $(V_{LTH}+V_{HTH})/2$, that is, the average value $(V_{TR})_{ave}$ of the sawtooth voltage $V_{TR}$ is sufficiently higher than the reference voltage $V_{Tref}$, the second error amplifier 201 has an output voltage $V_{Tref}$ of a minimum value. At this time, the currents $I_{CH}$ and $I_{DCH}$ also have a minimum value so that the oscillating frequency is the lowest frequency.

In addition, the output voltage $V_f$ of the second error amplifier 201 has become increased at a point that the average value $(V_{TR})_{ave}$ of the sawtooth voltage $V_{TR}$ is lower than the reference voltage $V_{Tref}$ by a synchronizing signal inputted from outside. Such result increases the current values of $I_{CH}$ and $I_{DCH}$, and the rising and falling slopes of the sawtooth wave increases. Then the average value $(V_{TR})_{ave}$ of the sawtooth voltage $V_{TR}$ increases again. That is, the second error amplifier 201 is operated in an active region, and the charge/discharge current of the capacitor $C_{TR}$ is controlled to cause both $(V_{TR})_{ave}$ and $V_{Tref}$ to be equal.

Accordingly, as shown in FIGS. 4A, 4B, and 4C, the amplitudes of the sawtooth voltage $V_{TR}$ inputted to the comparator 302 are always constantly maintained irrespective of the synchronizing signal. Therefore, the output of the comparator 302, namely, a pulse width modulating signal, remains stable.

In conclusion, the present invention provides a pulse width modulation control circuit which causes variation amplitudes of the sawtooth voltage in a sawtooth oscillator being synchronized by an external signal to be lowered, thereby improving both noise and system control characteristics. Such effects can be used in an integrated circuit (IC) for controlling a switching mode power supply.

What is claimed is:

1. A pulse width modulation circuit comprising:
    a sawtooth oscillating means for generating a sawtooth voltage after receiving a synchronizing signal;
    a sawtooth controller for receiving said sawtooth voltage generated from said sawtooth oscillating means, receiving a reference voltage with respect to said sawtooth voltage, and outputting a current controlling constantly the amplitude of said sawtooth voltage to said sawtooth oscillating means; and
    a pulse width modulating means for receiving an output voltage, also receiving a reference voltage with respect to said output voltage, then receiving said sawtooth voltage generated from said sawtooth oscillating means, and modulating pulse width of said sawtooth voltage.

2. A pulse width modulation circuit as defined in claim 1, wherein said sawtooth oscillating means is comprised of:
    a sawtooth oscillator for receiving said synchronizing signal, and outputting both said sawtooth voltage and a switching controlling voltage;
    a capacitor for charging or discharging said sawtooth voltage outputted from said sawtooth oscillator, said capacitor having one terminal connected to said sawtooth oscillator, said sawtooth controller, and said pulse width modulating means, and another terminal which is grounded; and
    a voltage controlled switch for controlling a charge/discharge current flowing in said capacitor according to said switching controlling voltage of said sawtooth oscillator, said switch having one side terminal connected to said pulse width modulating means, and another terminal connected to said sawtooth controller.

3. A pulse width modulation circuit as defined in claim 1, wherein said sawtooth controller is comprised of:
    an error amplifier for receiving said sawtooth voltage flowing in a resistor through a negative terminal of said error amplifier, also receiving said reference voltage concerning said sawtooth voltage through a positive terminal of said error amplifier, and including a capacitor between an output terminal of said error amplifier and said negative terminal; and
    a voltage-to-current converter for receiving said output voltage of said error amplifier, converting said output voltage to a current, and outputting said current to said sawtooth oscillating means.

4. A pulse width modulation circuit as defined in claim 1, wherein said pulse width modulating means is comprised of:

an error amplifier having a negative terminal, a positive terminal and an output terminal, respectively for receiving an output voltage flowing in a first resistor through said negative terminal, receiving said reference voltage to said output voltage through said positive terminal, and including a capacitor between said output terminal and said negative terminal; and a comparator having a negative terminal and a positive terminal, respectively for receiving an output of said first error amplifier through said positive terminal, receiving said sawtooth voltage of said sawtooth oscillating means through said negative terminal, and modulating pulse width of said sawtooth voltage.

* * * * *